US010142151B2

(12) United States Patent
Lee et al.

(10) Patent No.: US 10,142,151 B2
(45) Date of Patent: *Nov. 27, 2018

(54) PEAK TO AVERAGE POWER RATIO (PAPR) REDUCTION IN A WIRELESS NETWORK

(71) Applicant: NEWRACOM, INC., Irvine, CA (US)

(72) Inventors: Dae Won Lee, Irvine, CA (US); Yujin Noh, Irvine, CA (US); Sungho Moon, Irvine, CA (US)

(73) Assignee: NEWRACOM, INC., Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/595,005

(22) Filed: May 15, 2017

(65) Prior Publication Data

US 2017/0250848 A1 Aug. 31, 2017

Related U.S. Application Data

(63) Continuation of application No. 15/347,178, filed on Nov. 9, 2016, now Pat. No. 9,686,757.

(Continued)

(51) Int. Cl.
*H04B 1/66* (2006.01)
*H04L 27/26* (2006.01)
(Continued)

(52) U.S. Cl.
CPC .... *H04L 27/2621* (2013.01); *H03M 13/6544* (2013.01); *H04B 7/0456* (2013.01);
(Continued)

(58) Field of Classification Search
CPC ............... H04L 5/0053; H04L 27/2613; H04L 27/2636; H04L 1/0009; H04L 27/2633;
(Continued)

(56) References Cited

U.S. PATENT DOCUMENTS

2016/0135086 A1* 5/2016 Yang .................... H04L 1/0011
370/343

OTHER PUBLICATIONS

"Part 11: Wireless LAN Medium Access Control (MAC) and Physical Layer (PHY) Specifications", IEEE Standards 802.11™-2012 (Revision of IEEE Standard 802.11-2007), Mar. 29, 2012, pp. 1-2695, IEEE (The Institute of Electrical and Electronic Engineers, Inc.), New York, NY, USA.

(Continued)

*Primary Examiner* — Tu X Nguyen

(57) ABSTRACT

A wireless device generates a High Efficiency (HE) Physical layer Protocol Data Units (PPDU) including a non-High Throughput Signal (L-SIG) field and transmits the HE PPDU. Transmitting the HE PDDU includes transmitting a set of extra tones with the L-SIG field. The set of extra tones include a sequence of values, and first, second, third, and fourth values of the sequence of values respectively correspond to BPSK constellation values of −1, −1, −1, and +1. The set of extra tones may include −28th, −27th, 27th, and 28th subcarriers, relative to a center (zero) subcarrier, of a 20 MHz bandwidth of the HE PPDU, and may be used to transmit the first, second, third, and fourth values of the sequence of values, respectively. Another wireless device may receive the HE PPDU, and may use the set of extra tones to estimate a channel.

20 Claims, 6 Drawing Sheets

Related U.S. Application Data

(60) Provisional application No. 62/254,055, filed on Nov. 11, 2015.

(51) Int. Cl.

| | | |
|---|---|---|
| *H04W 52/36* | (2009.01) | |
| *H04W 52/38* | (2009.01) | |
| *H03M 13/00* | (2006.01) | |
| *H04B 7/0456* | (2017.01) | |
| *H04L 1/00* | (2006.01) | |
| *H04L 5/00* | (2006.01) | |

(52) U.S. Cl.
CPC .......... *H04L 1/0003* (2013.01); *H04L 1/0009* (2013.01); *H04L 1/0041* (2013.01); *H04L 5/0021* (2013.01); *H04L 27/2618* (2013.01); *H04W 52/36* (2013.01); *H04W 52/383* (2013.01)

(58) Field of Classification Search
CPC ........... H04L 27/2666; H04L 25/03891; H04L 27/2675; H04W 84/12
USPC ........................................................ 455/102
See application file for complete search history.

(56) References Cited

OTHER PUBLICATIONS

"Part 11: Wireless LAN Medium Access Control (MAC) and Physical Layer (PHY) Specifications, Amendment 4: Enhancements for Very High Throughput for Operation in Bands below 6 GHz", IEEE Standards 802.11 ac™-2013, 2013, pp. 1-395, IEEE (The Institute of Electrical and Electronic Engineers, Inc.), New York, NY, USA.

"Part 11: Wireless LAN Medium Access Control (MAC) and Physical Layer (PHY) Specifications, Amendment 2: Sub 1 GHz License Exempt Operation", IEEE P802.11ah™/ D5.0, Mar. 2015, pp. 1-604, IEEE (The Institute of Electrical and Electronic Engineers, Inc.), New York, NY, USA.

\* cited by examiner

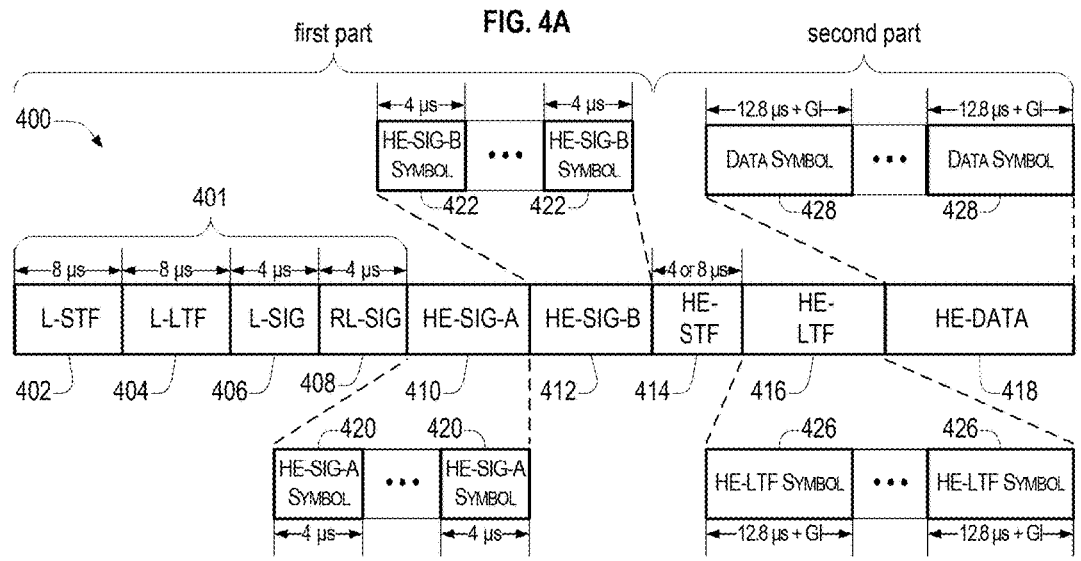

Table 1:

| Element | definition | duration | DFT period | GI | Subcarrier spacing |
|---|---|---|---|---|---|
| Legacy (L)-STF | Non-HT Short Training field | 8 μs | - | - | equiv. to 1,250 kHz |
| L-LTF | Non-HT Long Training field | 8 μs | 3.2 μs | 1.6 μs | 312.5 kHz |
| L-SIG | Non-HT Signal field | 4 μs | 3.2 μs | 0.8 μs | 312.5 kHz |
| RL-SIG | Repeated Non-HT SIGNAL field | 4 μs | 3.2 μs | 0.8 μs | 312.5 kHz |
| HE-SIG-A | HE SIGNAL A field | $N_{HESIGA} * 4$ μs | 3.2 μs | 0.8 μs | 312.5 kHz |
| HE-SIG-B | HE SIGNAL B field | $N_{HESIGB} * 4$ μs | 3.2 μs | 0.8 μs | 312.5 kHz |
| HE-STF | HE Short Training field | 4 or 8 μs | - | - | • non-trigger-based PPDU: (equiv. to) 1,250 kHz; • trigger-based PPDU: (equiv. to) 625 kHz |
| HE-LTF | HE Long Training field | $N_{HELTF} *$ (DFT period + GI)μs | 2xLTF: 6.4 μs 4xLTF: 12.8 μs | supports 0.8, 1.6, 3.2 μs | • 2xLTF: (equiv. to) 156.25 kHz; • 4xLTF: 78.125 kHz |
| HE-DATA | HE DATA field | $N_{DATA} *$ (DFT period + GI)μs | 12.8 μs | supports 0.8, 1.6, 3.2 μs | 78.125 kHz |

Table 2

| Seq. # | Sequence | | | | Maximum 99.9% PAPR |
|---|---|---|---|---|---|
| | k = -28 | k = -27 | k = +27 | k = +28 | |
| 1 | +1 | +1 | +1 | +1 | 11.5439890169176 |
| 2 | -1 | +1 | +1 | +1 | 11.7559798669756 |
| 3 | +1 | -1 | +1 | +1 | 11.0247632082654 |
| 4 | -1 | -1 | +1 | +1 | 11.1132462729183 |
| 5 | +1 | +1 | -1 | +1 | 11.0308568688696 |
| 6 | -1 | +1 | -1 | +1 | 11.2221732344942 |
| 7 | +1 | -1 | -1 | +1 | 10.4667832783689 |
| 8 | -1 | -1 | -1 | +1 | 10.5375311035243 |
| 9 | +1 | +1 | +1 | -1 | 11.7149578452610 |
| 10 | -1 | +1 | +1 | -1 | 12.3474566483288 |
| 11 | +1 | -1 | +1 | -1 | 11.1773385196315 |
| 12 | -1 | -1 | +1 | -1 | 11.7522509687256 |
| 13 | +1 | +1 | -1 | -1 | 11.0987234304853 |
| 14 | -1 | +1 | -1 | -1 | 11.7572701498639 |
| 15 | +1 | -1 | -1 | -1 | 10.5091551858028 |
| 16 | -1 | -1 | -1 | -1 | 11.1262697705930 |

Option 1 → 7
Option 2 → 8
Option 3 → 15

Table 3

| Seq# | Sequence | | | | Maximum 99.0% PAPR |
|---|---|---|---|---|---|
| | k = -28 | k = -27 | k = +27 | k = +28 | |
| 1 | +1 | +1 | +1 | +1 | 10.2706106595020 |
| 2 | -1 | +1 | +1 | +1 | 10.7363331311070 |
| 3 | +1 | -1 | +1 | +1 | 9.91154468364214 |
| 4 | -1 | -1 | +1 | +1 | 10.2800161947610 |
| 5 | +1 | +1 | -1 | +1 | 10.3023893730895 |
| 6 | -1 | +1 | -1 | +1 | 10.8164062029529 |
| 7 | +1 | -1 | -1 | +1 | 9.78948896317696 |
| 8 | -1 | -1 | -1 | +1 | 10.3164094519923 |
| 9 | +1 | +1 | +1 | -1 | 10.4323041382824 |
| 10 | -1 | +1 | +1 | -1 | 10.8492531738741 |
| 11 | +1 | -1 | +1 | -1 | 10.1837859104191 |
| 12 | -1 | -1 | +1 | -1 | 10.4427769469515 |
| 13 | +1 | +1 | -1 | -1 | 10.4044340151947 |
| 14 | -1 | +1 | -1 | -1 | 10.7918292766516 |
| 15 | +1 | -1 | -1 | -1 | 9.96623421218785 |
| 16 | -1 | -1 | -1 | -1 | 10.3583786056179 |

Opt. 4 → row 3
Opt. 5 → row 11

PEAK TO AVERAGE POWER RATIO (PAPR) REDUCTION IN A WIRELESS NETWORK

CROSS-REFERENCE TO RELATED APPLICATION

This application is a continuation of U.S. patent application Ser. No. 15/347,178, filed Nov. 9, 2016, now U.S. Pat. No. 9,686,757, issued Jun. 20, 2017, which claims the benefit of U.S. Provisional Patent Application No. 62/254,055, filed Nov. 11, 2015, which is incorporated by reference herein in its entireties.

BACKGROUND

1. Technical Field

The technology described herein relates generally to wireless networking. More particularly, the technology relates to reducing a Peak-to-Average Power Ratio (PAPR) in a transmission using Orthogonal Frequency Division Multiplexing (OFDM) in a wireless network.

2. Description of the Related Art

Wireless LAN (WLAN) devices are currently being deployed in diverse environments. Some of these environments have large numbers of access points (APs) and non-AP stations in geographically limited areas. In addition, WLAN devices are increasingly required to support a variety of applications such as video, cloud access, and offloading. In particular, video traffic is expected to be the dominant type of traffic in many high efficiency WLAN deployments. With the real-time requirements of some of these applications, WLAN users demand improved performance in delivering their applications, including improved power consumption for battery-operated devices.

A WLAN is being standardized by the IEEE (Institute of Electrical and Electronics Engineers) Part 11 under the name of "Wireless LAN Medium Access Control (MAC) and Physical Layer (PHY) Specifications." A series of standards have been adopted as the WLAN evolved, including IEEE Std 802.11™-2012 (March 2012) (IEEE 802.11n). The IEEE Std 802.11 was subsequently amended by IEEE Std 802.11ae™-2012, IEEE Std 802.11aa™-2012, IEEE Std 802.11ad™-2012, and IEEE Std 802.11ac™-2013 (IEEE 802.11ac).

In a WLAN, minimizing a Peak to Average Power Ratio (PAPR) improves a throughput of communications in the WLAN while adhering to regulatory and device power limitations. A high PAPR is one of the most detrimental aspects in an OFDM system as it decreases the signal-to-quantization noise ratio (SQNR) of the analog-digital convertor (ADC) and digital-analog convertor (DAC) used therein while degrading the efficiency of the power amplifier in the transmitter. A PAPR of an OFDM symbol may be as high as 17 decibels (dB).

Recently, an amendment focused on providing a High Efficiency (HE) WLAN in high-density scenarios is being developed by the IEEE 802.11ax task group. The 802.11ax amendment focuses on improving metrics that reflect user experience, such as average per station throughput, the 5th percentile of per station throughput of a group of stations, and area throughput. Improvements may be made to support environments such as wireless corporate offices, outdoor hotspots, dense residential apartments, and stadiums.

HE transmissions in an HE WLAN include a preamble section different from that of previous WLANs. The preamble section may have one of the highest PAPRs of any portion of the HE transmission, especially when the preamble is duplicated across bandwidths of the HE transmission.

SUMMARY

In an embodiment, a method performed by a wireless device comprises generating a High Efficiency (HE) Physical layer Protocol Data Units (PPDU) including a non-High Throughput Signal (L-SIG) field and transmitting the HE PPDU. Transmitting the HE PDDU includes transmitting a first set of extra tones with the L-SIG field. The first set of extra tones include a first sequence of values, and first, second, third, and fourth values of the first sequence of values respectively correspond to BPSK constellation values of −1, −1, −1, and +1.

In an embodiment, the first set of extra tones include −28th, −27th, 27th, and 28th subcarriers, relative to a center (zero) subcarrier, of a 20 MHz bandwidth of the HE PPDU.

In an embodiment, the first, second, third, and fourth values of the first sequence of values are respectively transmitted in the −28th, −27th, 27th, and 28th subcarriers of the first set of extra tones.

In an embodiment, the HE PPDU further includes a Repeated L-SIG (RL-SIG) field which immediately follows the L-SIG field, and transmitting the HE PPDU further includes transmitting a second set of extra tones with the RL-SIG field. The second set of extra tones include a second sequence of values, and the first, second, third, and fourth values of the second sequence of values respectively correspond to BPSK constellation values of −1, −1, −1, and +1.

In an embodiment, the second set of extra tones include a −28th, −27th, 27th, and 28th subcarriers, relative to a center (zero) subcarrier, of a 20 MHz bandwidth of the HE PPDU.

In an embodiment, the first, second, third, and fourth values of the second sequence of values are respectively transmitted in the −28th, −27th, 27th, and 28th subcarriers of the second set of extra tones.

In an embodiment, a duration of the L-SIG field is 4 µs, and a duration of the RL-SIG field is 4 µs.

In an embodiment, a subcarrier spacing of the L-SIG field is 312.5 kHz, and a subcarrier spacing of the RL-SIG field is 312.5 kHz.

In an embodiment, the L-SIG field has a guard interval of 0.8 µs, and the RL-SIG field has a guard interval of 0.8 µs.

In an embodiment, the L-SIG field has a discrete Fourier transform (DFT) period of 3.2 µs, and the RL-SIG field has a DFT period of 3.2 µs.

In an embodiment, a method performed by a wireless device comprises receiving a High Efficiency (HE) Physical Layer Protocol Data Units (PPDU) including a non-High Throughput Signal (L-SIG) field and detecting a first set of extra tones with the L-SIG field, a first set of extra tones being transmitted with a first sequence of values. First, second, third, and fourth values of the first sequence of values respectively correspond to BPSK constellation values of −1, −1, −1, and +1.

In an embodiment, the first set of extra tones include −28th, −27th, 27th, and 28th subcarriers, relative to a center (zero) subcarrier, of a 20 MHz bandwidth of the HE PPDU.

In an embodiment, the first, second, third, and fourth values of the first sequence of values are respectively transmitted in the −28th, −27th, 27th, and 28th subcarriers of the first set of extra tones.

In an embodiment, the HE PPDU further includes a Repeated L-SIG (RL-SIG) field which immediately follows the L-SIG field, and the method further comprises detecting a second set of extra tones with the RL-SIG field. The second set of extra tones were transmitted with a second sequence of values. First, second, third, and fourth values of the second sequence of values respectively correspond to BPSK constellation values of −1, −1, −1, and +1.

In an embodiment, the second set of extra tones include −28th, −27th, 27th, and 28th subcarriers, relative to a center (zero) subcarrier, of a 20 MHz bandwidth of the HE PPDU.

In an embodiment, the first, second, third, and fourth values of the second sequence of values are respectively transmitted in the −28th, −27th, 27th, and 28th subcarriers of the second set of extra tones.

In an embodiment, a duration of the L-SIG field is 4 µs, and a duration of the RL-SIG field is 4 µs.

In an embodiment, a subcarrier spacing of the L-SIG field is 312.5 kHz, and a subcarrier spacing of the RL-SIG field is 312.5 kHz.

In an embodiment, the L-SIG field has a guard interval of 0.8 µs, and the RL-SIG field has a guard interval of 0.8 µs.

In an embodiment, the method further comprises estimating a channel by using the first set of extra tones and the second set of extra tones.

BRIEF DESCRIPTION OF THE DRAWINGS

FIG. 4A illustrates an HE Physical Layer Protocol Data Units (PPDU), according to an embodiment.

FIG. 4B shows a Table 1 disclosing additional properties of fields of the HE PPDU frame of FIG. 4A, according to an embodiment.

DETAILED DESCRIPTION

Figure 1:
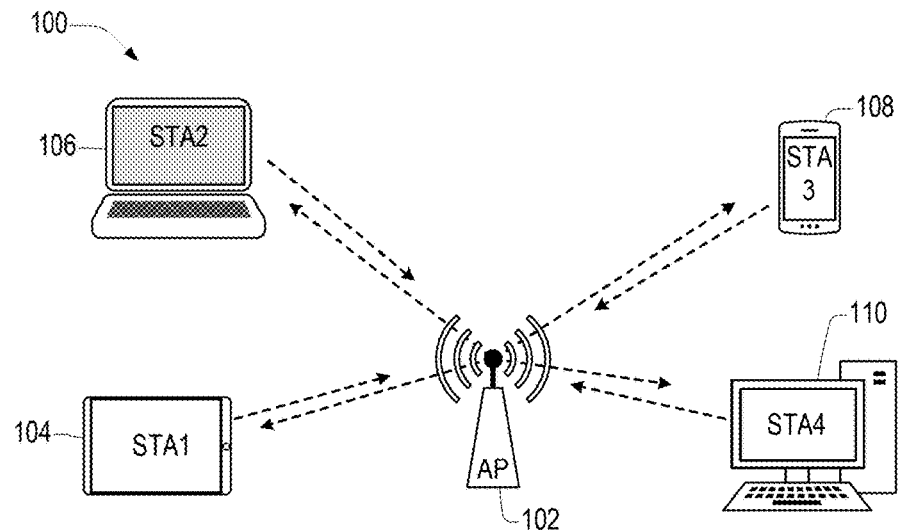
FIG. 1 illustrates a wireless network according to an embodiment.

The technology described herein relates generally to wireless networking. More particularly, the technology relates to techniques for reducing a Peak-to-Average Power Ratio (PAPR) in a preamble of a High Efficiency (HE) Physical Layer Protocol Data Units (PPDU).

In the following detailed description, certain illustrative embodiments have been illustrated and described. As those skilled in the art would realize, these embodiments are capable of modification in various different ways without departing from the scope of the present disclosure. Accordingly, the drawings and description are to be regarded as illustrative in nature and not restrictive. Like reference numerals designate like elements in the specification.

FIG. 1 illustrates a wireless network according to an embodiment. The wireless network includes an infrastructure Basic Service Set (BSS) 100 of a Wireless Local Area Network (WLAN). In an 802.11 wireless LAN (WLAN), the BSS provides the basic organizational unit and typically includes an Access Point (AP) and one or more associated stations (STAs). In FIG. 1, the BSS 100 includes an Access Point 102 (also referred to as the AP) wirelessly communicating with first, second, third, and fourth wireless devices (or stations) 104, 106, 108, and 110 (also referred to as stations STA1, STA2, STA3, and STA4, respectively). The wireless devices may each include a medium access control layer (MAC) and a physical layer (PHY) according to an IEEE 802.11 standard.

Although FIG. 1 shows the BSS 100 including only the first to fourth stations STA1 to STA4, embodiments are not limited thereto and may comprise BSSs including any number of stations.

The AP 102 is a station, that is, a STA, configured to control and coordinate functions of the BSS 100. The AP 102 may transmit information to a single station selected from the plurality of stations STA1 to STA4 in the BSS 100 using a single frame, or may simultaneously transmit information to two or more of the stations STA1 to STA4 in the BSS 100 using either a single Orthogonal Frequency Division Multiplexing (OFDM) broadcast frame, a single OFDM Multi-User Multi-Input-Multi-Output (MU-MIMO) transmission, a single Orthogonal Frequency Division Multiple Access (OFDMA) frame, or a single MU-MIMO OFDMA frame.

The stations STA1 to STA4 may each transmit data to the AP 102 using a single frame, or transmit information to and receive information from each other using a single frame. Two or more of the stations STA1 to STA4 may simultaneously transmit data to the AP 102 using an Uplink (UL) OFDMA frame, an UL MU-MIMO frame, or an UL MU-MIMO OFDMA frame.

In another embodiment, the AP 102 may be absent and the stations STA1 to STA4 may be in an ad-hoc network.

Each of the stations STA1 to STA4 and the AP 102 includes a processor and a transceiver, and may further include a user interface and a display device.

The processor is configured to generate a frame to be transmitted through a wireless network, to process a frame received through the wireless network, and to execute protocols of the wireless network. The processor may perform some or all of its functions by executing computer programming instructions stored on a non-transitory computer-readable medium.

The transceiver represents a unit functionally connected to the processor, and designed to transmit and receive a frame through the wireless network. The transceiver may include a single component that performs the functions of transmitting and receiving, or two separate components each performing one of such functions.

The processor and transceiver of the stations STA1 to STA4 and the AP 102 may be respectively implemented using hardware components, software components, or both.

The AP 102 may be or may include a WLAN router, a stand-alone Access Point, a WLAN bridge, a Light-Weight Access Point (LWAP) managed by a WLAN controller, and the like. In addition, a device such as a personal computer, tablet computer, or cellular phone may configured able to operate as the AP 102, such as when a cellular phone is configured to operate as a wireless "hot spot."

Each of the stations STA1 to STA4 may be or may include a desktop computer, a laptop computer, a tablet PC, a wireless phone, a mobile phone, a smart phone, an e-book reader, a Portable Multimedia Player (PMP), a portable game console, a navigation system, a digital camera, a Digital Multimedia Broadcasting (DMB) player, a digital audio recorder, a digital audio player, a digital picture recorder, a digital picture player, a digital video recorder, a digital video player, and the like.

The present disclosure may be applied to WLAN systems according to IEEE 802.11 standards but embodiments are not limited thereto.

In IEEE 802.11 standards, frames exchanged between stations (including access points) are classified into management frames, control frames, and data frames. A management frame may be a frame used for exchanging management information that is not forwarded to a higher layer of a communication protocol stack. A control frame may be a frame used for controlling access to a medium. A data frame may be a frame used for transmitting data to be forwarded to the higher layer of the communication protocol stack.

A type and subtype of a frame may be identified using a type field and a subtype field included in a control field of the frame, as prescribed in the applicable standard.

Figure 2:
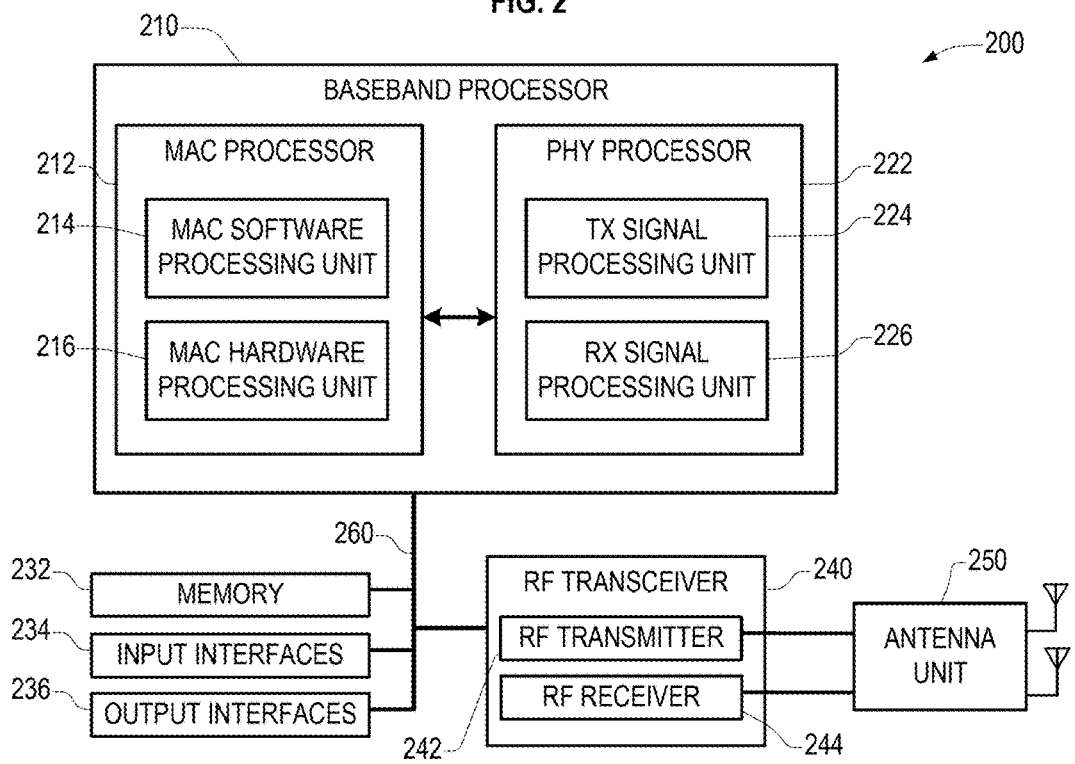
FIG. 2 is a schematic diagram of a wireless device, according to an embodiment.

FIG. 2 illustrates a schematic block diagram of a wireless device 200 according to an embodiment. The wireless or WLAN device 200 may be included in the AP 102 or any of the stations STA1 to STA4 in FIG. 1. The WLAN device 200 includes a baseband processor 210, a radio frequency (RF) transceiver 240, an antenna unit 250, a storage device (e.g., memory) 232, one or more input interfaces 234, and one or more output interfaces 236. The baseband processor 210, the memory 232, the input interfaces 234, the output interfaces 236, and the RF transceiver 240 may communicate with each other via a bus 260.

The baseband processor 210 performs baseband signal processing, and includes a MAC processor 212 and a PHY processor 222. The baseband processor 210 may utilize the memory 232, which may include a non-transitory computer readable medium having software (e.g., computer programming instructions) and data stored therein.

In an embodiment, the MAC processor 212 includes a MAC software processing unit 214 and a MAC hardware processing unit 216. The MAC software processing unit 214 may implement a first plurality of functions of the MAC layer by executing MAC software, which may be included in the software stored in the memory 232. The MAC hardware processing unit 216 may implement a second plurality of functions of the MAC layer in special-purpose hardware. However, the MAC processor 212 is not limited thereto. For example, the MAC processor 212 may be configured to perform the first and second plurality of functions entirely in software or entirely in hardware according to an implementation.

The PHY processor 222 includes a transmitting signal processing unit (SPU) 224 and a receiving SPU 226. The PHY processor 222 implements a plurality of functions of the PHY layer. These functions may be performed in software, hardware, or a combination thereof according to an implementation.

Functions performed by the transmitting SPU 224 may include one or more of Forward Error Correction (FEC) encoding, stream parsing into one or more spatial streams, diversity encoding of the spatial streams into a plurality of space-time streams, spatial mapping of the space-time streams to transmit chains, inverse Fourier Transform (iFT) computation, Cyclic Prefix (CP) insertion to create a Guard Interval (GI), and the like. Functions performed by the receiving SPU 226 may include inverses of the functions performed by the transmitting SPU 224, such as GI removal, Fourier Transform computation, and the like.

The RF transceiver 240 includes an RF transmitter 242 and an RF receiver 244. The RF transceiver 240 is configured to transmit first information received from the baseband processor 210 to the WLAN, and provide second information received from the WLAN to the baseband processor 210.

The antenna unit 250 includes one or more antennas. When Multiple-Input Multiple-Output (MIMO) or Multi-User MIMO (MU-MIMO) is used, the antenna unit 250 may include a plurality of antennas. In an embodiment, the antennas in the antenna unit 250 may operate as a beam-formed antenna array. In an embodiment, the antennas in the antenna unit 250 may be directional antennas, which may be fixed or steerable.

The input interfaces 234 receive information from a user, and the output interfaces 236 output information to the user. The input interfaces 234 may include one or more of a keyboard, keypad, mouse, touchscreen, microphone, and the like. The output interfaces 236 may include one or more of a display device, touch screen, speaker, and the like.

As described herein, many functions of the WLAN device 200 may be implemented in either hardware or software. Which functions are implemented in software and which functions are implemented in hardware will vary according to constraints imposed on a design. The constraints may include one or more of design cost, manufacturing cost, time to market, power consumption, available semiconductor technology, and so on.

As described herein, a wide variety of electronic devices, circuits, firmware, software, and combinations thereof may be used to implement the functions of the components of the WLAN device 200. Furthermore, the WLAN device 200 may include other components, such as application processors, storage interfaces, clock generator circuits, power supply circuits, and the like, which have been omitted in the interest of brevity.

Figure 3A:
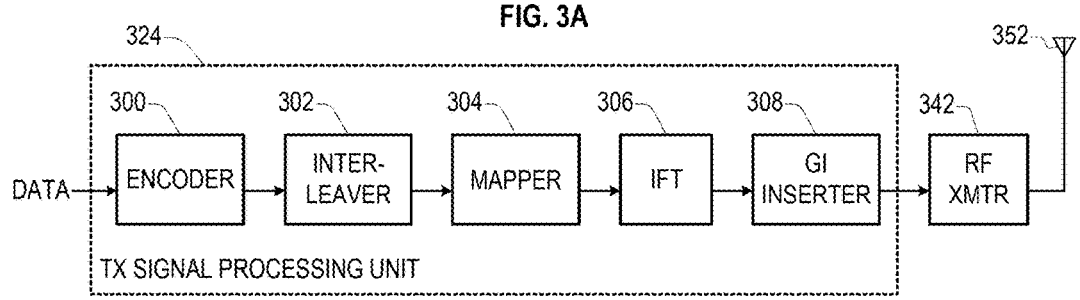
FIG. 3A illustrates components of a wireless device configured to transmit data, according to an embodiment.

FIG. 3A illustrates components of a wireless device configured to transmit data according to an embodiment, including a Transmitting (Tx) SPU (TxSP) 324, an RF transmitter 342, and an antenna 352. In an embodiment, the TxSP 324, the RF transmitter 342, and the antenna 352 correspond to the transmitting SPU 224, the RF transmitter 242, and an antenna of the antenna unit 250 of FIG. 2, respectively.

The TxSP 324 includes an encoder 300, an interleaver 302, a mapper 304, an inverse Fourier transformer (IFT) 306, and a guard interval (GI) inserter 308.

The encoder 300 receives and encodes input data DATA. In an embodiment, the encoder 300 includes a forward error correction (FEC) encoder. The FEC encoder may include a binary convolutional code (BCC) encoder followed by a puncturing device. The FEC encoder may include a low-density parity-check (LDPC) encoder.

The TxSP 324 may further include a scrambler for scrambling the input data before the encoding is performed by the encoder 300 to reduce the probability of long sequences of 0s or 1s. When the encoder 300 performs the BCC encoding, the TxSP 324 may further include an encoder parser for demultiplexing the scrambled bits among a plurality of BCC encoders. If LDPC encoding is used in the encoder, the TxSP 324 may not use the encoder parser.

The interleaver 302 interleaves the bits of each stream output from the encoder 300 to change an order of bits therein. The interleaver 302 may apply the interleaving only when the encoder 300 performs the BCC encoding, and otherwise may output the stream output from the encoder 300 without changing the order of the bits therein.

The mapper 304 maps the sequence of bits output from the interleaver 302 to constellation points. If the encoder 300 performed LDPC encoding, the mapper 304 may also perform LDPC tone mapping in addition to the constellation mapping.

When the TxSP 324 performs a MIMO or MU-MIMO transmission, the TxSP 324 may include a plurality of interleavers 302 and a plurality of mappers 304 according to a number of spatial streams (NSS) of the transmission. The TxSP 324 may further include a stream parser for dividing the output of the encoder 300 into blocks and may respectively send the blocks to different interleavers 302 or mappers 304. The TxSP 324 may further include a space-time block code (STBC) encoder for spreading the constellation points from the spatial streams into a number of space-time streams (NSTS) and a spatial mapper for mapping the space-time streams to transmit chains. The spatial mapper may use direct mapping, spatial expansion, or beamforming.

The IFT 306 converts a block of the constellation points output from the mapper 304 (or, when MIMO or MU-MIMO is performed, the spatial mapper) to a time domain block (i.e., a symbol) by using an inverse discrete Fourier transform (IDFT) or an inverse fast Fourier transform (IFFT). If the STBC encoder and the spatial mapper are used, the IFT 306 may be provided for each transmit chain.

When the TxSP 324 performs a MIMO or MU-MIMO transmission, the TxSP 324 may insert cyclic shift diversities (CSDs) to prevent unintentional beamforming. The TxSP 324 may perform the insertion of the CSD before or after the IFT 306. The CSD may be specified per transmit chain or may be specified per space-time stream. Alternatively, the CSD may be applied as a part of the spatial mapper.

When the TxSP 324 performs a MIMO or MU-MIMO transmission, some blocks before the spatial mapper may be provided for each user.

The GI inserter 308 prepends a GI to each symbol produced by the IFT 306. Each GI may include a Cyclic Prefix (CP) corresponding to a repeated portion of the end of the symbol that the GI precedes. The TxSP 324 may optionally perform windowing to smooth edges of each symbol after inserting the GI.

The RF transmitter 342 converts the symbols into an RF signal and transmits the RF signal via the antenna 352. When the TxSP 324 performs a MIMO or MU-MIMO transmission, the GI inserter 308 and the RF transmitter 342 may be provided for each transmit chain.

Figure 3B:
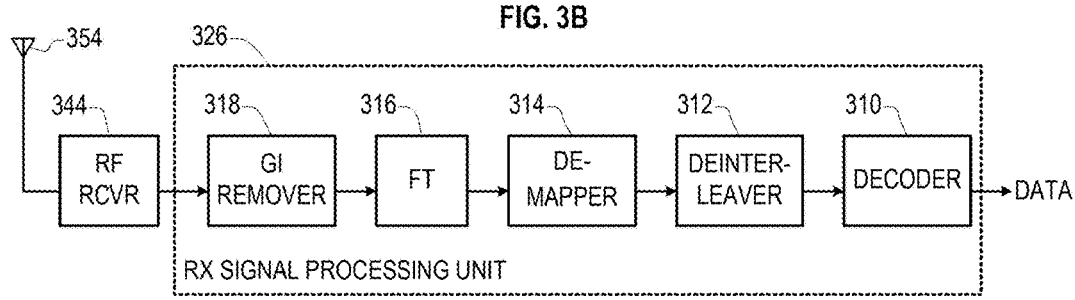
FIG. 3B illustrates components of a wireless device configured to receive data, according to an embodiment.

FIG. 3B illustrates components of a wireless device configured to receive data according to an embodiment, including a Receiver (Rx) SPU (RxSP) 326, an RF receiver 344, and an antenna 354. In an embodiment, the RxSP 326, RF receiver 344, and antenna 354 may correspond to the receiving SPU 226, the RF receiver 244, and an antenna of the antenna unit 250 of FIG. 2, respectively.

The RxSP 326 includes a GI remover 318, a Fourier transformer (FT) 316, a demapper 314, a deinterleaver 312, and a decoder 310.

The RF receiver 344 receives an RF signal via the antenna 354 and converts the RF signal into symbols. The GI remover 318 removes the GI from each of the symbols. When the received transmission is a MIMO or MU-MIMO transmission, the RF receiver 344 and the GI remover 318 may be provided for each receive chain.

The FT 316 converts each symbol (that is, each time domain block) into a frequency domain block of constellation points by using a discrete Fourier transform (DFT) or a fast Fourier transform (FFT). The FT 316 may be provided for each receive chain.

When the received transmission is the MIMO or MU-MIMO transmission, the RxSP 326 may include a spatial demapper for converting the respective outputs of the FTs 316 of the receiver chains to constellation points of a plurality of space-time streams, and an STBC decoder for despreading the constellation points from the space-time streams into one or more spatial streams.

The demapper 314 demaps the constellation points output from the FT 316 or the STBC decoder to bit streams. If the received transmission was encoded using the LDPC encoding, the demapper 314 may further perform LDPC tone demapping before performing the constellation demapping.

The deinterleaver 312 deinterleaves the bits of each stream output from the demapper 314. The deinterleaver 312 may perform the deinterleaving only when the received transmission was encoded using the BCC encoding, and otherwise may output the stream output by the demapper 314 without performing deinterleaving.

When the received transmission is the MIMO or MU-MIMO transmission, the RxSP 326 may use a plurality of demappers 314 and a plurality of deinterleavers 312 corresponding to the number of spatial streams of the transmission. In this case, the RxSP 326 may further include a stream deparser for combining the streams output from the deinterleavers 312.

The decoder 310 decodes the streams output from the deinterleaver 312 or the stream deparser. In an embodiment, the decoder 312 includes an FEC decoder. The FEC decoder may include a BCC decoder or an LDPC decoder.

The RxSP 326 may further include a descrambler for descrambling the decoded data. When the decoder 310 performs the BCC decoding, the RxSP 326 may further include an encoder deparser for multiplexing the data decoded by a plurality of BCC decoders. When the decoder 310 performs the LDPC decoding, the RxSP 326 may not use the encoder deparser.

Before making a transmission, wireless devices such as wireless device 200 will assess the availability of the wireless medium using Clear Channel Assessment (CCA). If the medium is occupied, CCA may determine that it is busy, while if the medium is available, CCA determines that it is idle.

The PHY entity for IEEE Std 802.11 is based on Orthogonal Frequency Division Multiplexing (OFDM) or Orthogonal Frequency Division Multiple Access (OFDMA). In either OFDM or OFDMA Physical (PHY) layers, a STA is capable of transmitting and receiving Physical Layer Protocol Data Units (PPDUs) that are compliant with the mandatory PHY specifications. A PHY specification defines a set of Modulation and Coding Schemes (MCS) and a maximum number of spatial streams. Some PHY entities define downlink (DL) and uplink (UL) Multi-User (MU) transmissions having a maximum number of space-time streams (STS) per user and employing up to a predetermined total number of STSs.

A PHY entity may define PPDUs that are individually addressed using an Association Identifier (AID) or Partial AID and may also define PPDUs that are group addressed based on Group ID (GID).

A PHY entity may provide support for 20 MHz, 40 MHz, 80 MHz, and 160 MHz contiguous channel widths and support for an 80+80 MHz non-contiguous channel width. Each channel includes a plurality of subcarriers, which may also be referred to as tones. Data subcarriers within the channels may be modulated using binary phase shift keying (BPSK), quadrature phase shift keying (QPSK), 16-quadrature amplitude modulation (16-QAM), 64-QAM, and 256-QAM. Forward error correction (FEC) coding (such as convolutional or Low Density Parity Check (LDPC) coding) may be used with coding rates of ½, ⅔, ¾ and ⅚.

A PHY entity may define fields denoted as Legacy Signal (L-SIG), Signal A (SIG-A), and Signal B (SIG-B) within which some necessary information about PHY Service Data Unit (PSDU) attributes are communicated. For example, a High Efficiency (HE) PHY entity may define an L-SIG field, an HE-SIG-A field, and an HE-SIG-B field. In an embodiment, the symbols in the L-SIG, SIG-A, and SIG-B fields are encoded with the most robust (and therefore least efficient) MCS of the PHY entity.

To prevent excessive consumption of WLAN resource by overhead, the L-SIG, HE-SIG-A, and HE-SIG-B fields have a limited number of bits and it is advantageous to encode them in the most compact form possible. In a receiving STA, the symbols of these fields are decoded first in order to obtain vital information about the PSDU attributes and some MAC attributes.

In the IEEE Std 802.11ac, SIG-A and SIG-B fields are called VHT SIG-A and VHT SIG-B fields. Hereinafter, IEEE Std 802.11ax SIG-A and SIG-B fields are respectively referred to as HE-SIG-A and HE-SIG-B fields.

FIG. 4A illustrates an HE PPDU 400 according to an embodiment. A transmitting station generates the HE PPDU frame 400 and transmits it to one or more receiving stations. The receiving stations receive, detect, and process the HE PPDU frame 400.

The HE PPDU frame 400 includes a Legacy Short Training Field (L-STF) field 402, a Legacy (i.e., a Non-High Throughput (Non-HT)) Long Training Field (L-LTF) 404, a Legacy Signal (L-SIG) field 406, and a Repeated L-SIG field (RL-SIG) 408, which together comprise a legacy preamble 401. The L-STF 404 of a non-trigger-based PPDU has a periodicity of 0.8 µs with 10 periods.

The HE PPDU frame 400 also includes an HE-SIG-A field 410, an optional HE-SIG-B field 412, an HE-STF 414, an HE-LTF 416, and an HE-Data field 418.

The legacy preamble 401, the HE-SIG-A field 410, and the HE-SIG-B field 412 when present, comprise a first part of the HE PPDU frame 400. In an embodiment, the first part of the HE PPDU frame 400 is decoded using a 64-element Discrete Fourier Transform (DFT), having a basic subcarrier spacing of 312.5 KHz.

The HE-SIG-A field 410 is duplicated on each 20 MHz segment after the legacy preamble to indicate common control information. The HE-SIG-A field 410 includes a plurality of OFDM HE-SIG-A symbols 420 each having a duration (including a Guard Interval (GI)) of 4 µs. A number of the HE-SIG-A symbols 420 in the HE-SIG-A field 410 is indicated by $N_{HESIGA}$ and is either 2 or 4.

The HE-SIG-B field 412 is included in Down-Link (DL) Multi-User (MU) PPDUs. The HE-SIG-B field 412 includes a plurality of OFDM HE-SIG-B symbols 422 each having a duration including a Guard Interval (GI) of 4 µs. In embodiments, Single User (SU) PPDUs, Up-Link (UL) MU PPDUs, or both do not include the HE-SIG-B field 412. A number of the HE-SIG-B symbols 422 in the HE-SIG-B field 412 is indicated by $N_{HESIGB}$ and is variable.

When the HE PPDU 400 has a bandwidth of 40 MHz or more, the HE-SIG-B field 412 may be transmitted in first and second HE-SIG-B channels 1 and 2. The HE-SIG-B field in the HE-SIG-B channel 1 is referred to as the HE-SIG-B1 field, and the HE-SIG-B field in the HE-SIG-B channel 2 is referred to as the HE-SIG-B2 field. The HE-SIG-B1 field and the HE-SIG-B2 field are communicated using different 20 MHz bandwidths of the HE PPDU 400, and may contain different information. Within this document, the term "HE-SIG-B field" may refer to an HE-SIG-B field of a 20 MHz PPDU, or to either of an HE-SIG-B1 field or HE-SIG-B2 field of a 40 MHz or more PPDU.

An HE-STF 414 of a non-trigger-based PPDU has a periodicity of 0.8 µs with 5 periods. A non-trigger-based PPDU is a PPDU that is not sent in response to a trigger frame. An HE-STF 414 of a trigger-based PPDU has a periodicity of 1.6 µs with 5 periods. Trigger-based PPDUs include UL PPDUs sent in response to respective trigger frames.

The HE-LTF 416 includes one or more OFDM HE-LTF symbols 426 each having a duration of 12.8 µs plus a Guard Interval (GI). The HE PPDU frame 400 may support a 2×LTF mode and a 4×LTF mode. In the 2×LTF mode, an HE-LTF symbol 426 excluding a Guard Interval (GI) is equivalent to modulating every other tone in an OFDM symbol of 12.8 µs excluding the GI, and then removing the second half of the OFDM symbol in a time domain. A number of the HE-LTF symbols 426 in the HE-LTF field 416 is indicated by $N_{HELTF}$, and is equal to 1, 2, 4, 6, or 8.

The HE-Data field 418 includes one or more OFDM HE-Data symbols 428 each having a duration of 12.8 µs plus a Guard Interval (GI). A number of the HE-Data symbols 428 in the HE-Data field 418 is indicated by $N_{DATA}$ and is variable.

FIG. 4B shows a Table 1 indicating additional properties of the fields of the HE PPDU frame 400 of FIG. 4A, according to an embodiment.

The descriptions below, for sake of completeness and brevity, refer to OFDM-based 802.11 technology. Unless otherwise indicated, a station refers to a non-AP HE STA, and an AP refers to an HE AP.

Figure 5:
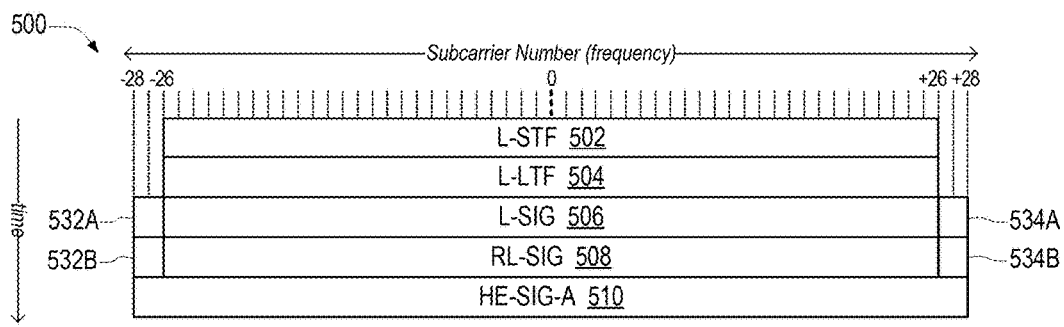
FIG. 5 illustrates a portion of subcarriers used by a preamble of an HE PPDU, according to an embodiment.

FIG. 5 illustrates a portion of subcarriers used by a preamble of an HE PPDU 500, according to an embodiment. In particular, FIG. 5 illustrates the use of subcarriers −28, −27, +27, and +28, relative to a center subcarrier 0, within each 20 MHz of the HE PPDU 500. Details of the use of subcarriers −26 to 26 (such as null subcarriers included therein) and of subcarriers −29 and below and +29 and above are not shown.

In the HE PPDU 500, subcarriers −28, −27, +27, and +28 are not used while the L-STF 502 and the L-LTF 504 are being transmitted.

Furthermore, the subcarriers −28, −27, +27, and +28 are "extra tones" that are not used to transmit the L-SIG field 506 and the RL-SIG-field 508. Instead, while the L-SIG field 506 is being transmitted (using, among other subcarriers, subcarriers having indexes in the range −26 to 26), first and second values are respectively transmitted in the subcarriers −28 and −27 to provide first channel estimation tones 532A, and third and fourth values are respectively transmitted in the subcarriers +27 and +28 to provide second channel estimation tones 534A.

While the RL-SIG field 508 is being transmitted (using, among other subcarriers, subcarriers having indexes in the range −26 to 26), the first and second values are again respectively transmitted in the subcarriers −28 and −27 to provide third channel estimation tones 532B, and the third and fourth values are again respectively transmitted in the subcarriers +27 and +28 to provide fourth channel estimation tones 534B.

When the HE PPDU 500 has a bandwidth of more than 20 MHz, the first, second, third, and fourth channel estimation tones 532A, 534A, 532B, and 534B are duplicated in each 20 MHz of the bandwidth of the HE PPDU 500.

The first to fourth values transmitted in the subcarriers −28, −27, +27, and +28, respectively, are used to provide a pilot sequence for performing channel estimation for edge bands in an HE-SIG-A field 510 and in signals that follow after the HE-SIG-A field 510.

The pilot sequence for channel estimation provided by the channel estimation tones 532A, 534A, 532B, and 534B in system according to the 802.11ax standard affect a PAPR of the preamble signal. Notably, a defined sequence may be used for the channel estimation tones 532A, 534A, 532B, and 534B that reduces the probable PAPR of the preamble.

In an embodiment, a sequence {+1 −1 −1 +1} is used for subcarriers {−28, −27, +27, +28}, respectively, within each 20 MHz bandwidth of an HE PPDU to provide the first and second channel estimation tones 532A and 534A that are transmitted simultaneously with the L-SIG field 506. The same sequence is also used to provide the third and fourth channel estimation tones 532B and 534B that are transmitted with the RL-SIG field 508.

In another embodiment, a sequence {+1 −1 −1 −1} is used for subcarriers {−28, −27, +27, +28}, respectively, within each 20 MHz bandwidth of an HE PPDU to provide the first and second channel estimation tones 532A and 534A that are transmitted simultaneously with the L-SIG field 506. The same sequence is also used to provide the third and fourth channel estimation tones 532B and 534B that are transmitted with the RL-SIG field 508.

In another embodiment, a sequence {−1, −1, −1, +1} is used for subcarriers {−28, −27, +27, +28}, respectively, within each 20 MHz bandwidth of an HE PPDU to provide the first and second channel estimation tones 532A and 534A that are transmitted simultaneously with the L-SIG field 506. The same sequence is also used to provide the third and fourth channel estimation tones 532B and 534B that are transmitted with the RL-SIG field 508.

Figure 6:
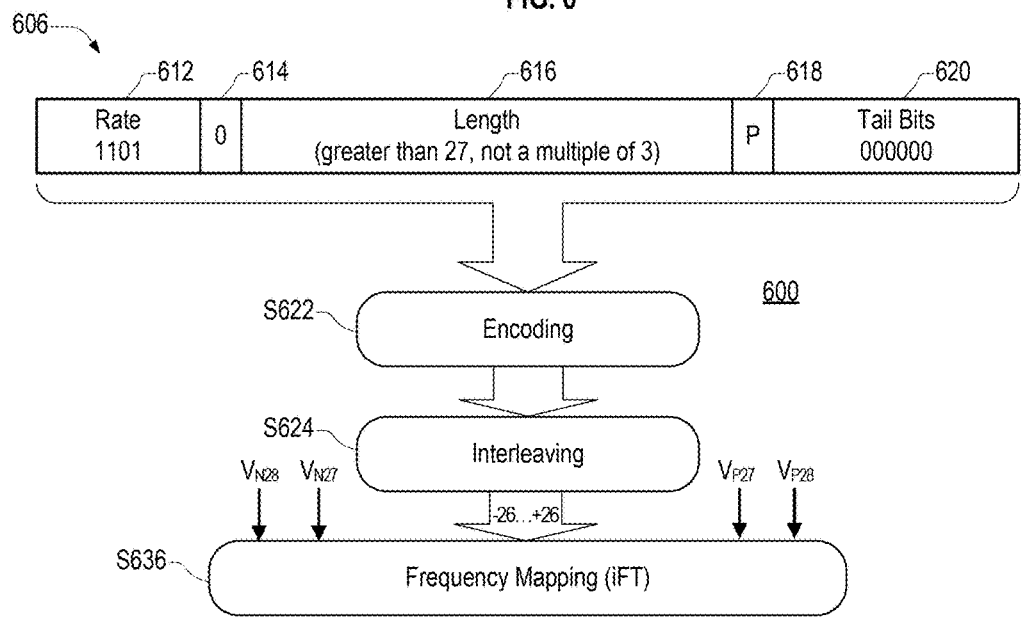
FIG. 6 illustrates a process for transmitting a Legacy Signal (L-SIG) or Repeated Legacy Signal (RL-SIG) field in an HE PPDU, according to an embodiment.

FIG. 6 illustrate a process 600 of embedding of the additional tones for subcarriers −28, −27, 27, and 28 into an L-SIG field 606 and how contents of the L-SIG field 606 for an HE PPDU is processed in preparation for transmission. The L-SIG field 606 contains a rate subfield 612, a reserved bit 614, a length subfield 616, a parity bit 618, and trellis termination tail bits 620.

In an HE PPDU, the rate subfield 612 always indicates the lowest rate of 6 Mbps, which corresponds to a binary value 1101. The reserved bit 614 is always set to 0, and the tail bits 620 are always set to 000000.

In an HE PPDU, the length subfield 616 can contain any numeric value which is not an integer multiple of three (that is, the value of the length subfield 616 modulo 3 must be equal to either 1 or 2). Furthermore, the length subfield 616 must have a value larger than 27 (decimal).

The value of the parity bit 618 is the parity of all the fields in L-SIG field 606 (excluding the tail bits 620).

Because the preamble of an HE PPDU may be the portion of the HE PPDU having a highest (i.e., worst) PAPR, and because the values used in the extra tones of L-SIG and RL-SIG fields of the HE PPDU affect the PAPR, measurements of the PAPR of transmitted L-SIG field OFDM symbols with the extra tones where performed using each possible combinations of either {+1 or −1} BPSK constellation values for each of the extra tones, in combination with all valid L-SIG content values for the HE PPDU. From the results, sets of sequences were identified for the extra tones that resulted in reduced PAPRs for all possible L-SIG contents. The PAPR was measured with 99.9% and 99.0% peak power to average power ratios.

To perform the measurements, in the process 600 values for the R-SIG field 606 where generated that included each valid value for the length subfield 616 and a corresponding value for the parity bit 618. At S622, the generated values for the R-SIG field 606 where encoded for transmission, and the encoded values corresponding to the values of the R-SIG field 606 were interleaved at S624.

At S636, sequences including all possible combinations of {−1, +1} values for the inputs $V_{N28}$, $V_{N27}$, $V_{P27}$, and $V_{P28}$ respectively corresponding to values of the subcarriers −28, −27, 27, and 28 were generated. Each sequence was combined with each of the interleaved encoded values corresponding to the values for the R-SIG field 606 and then frequency mapped using an inverse Fourier Transform (iFT), for example, an inverse Fast Fourier Transform (iFFT), performed on the resulting combinations. PAPRs for each combination were then determined using corresponding outputs of the frequency mapping.

Figures 7A, 7B:
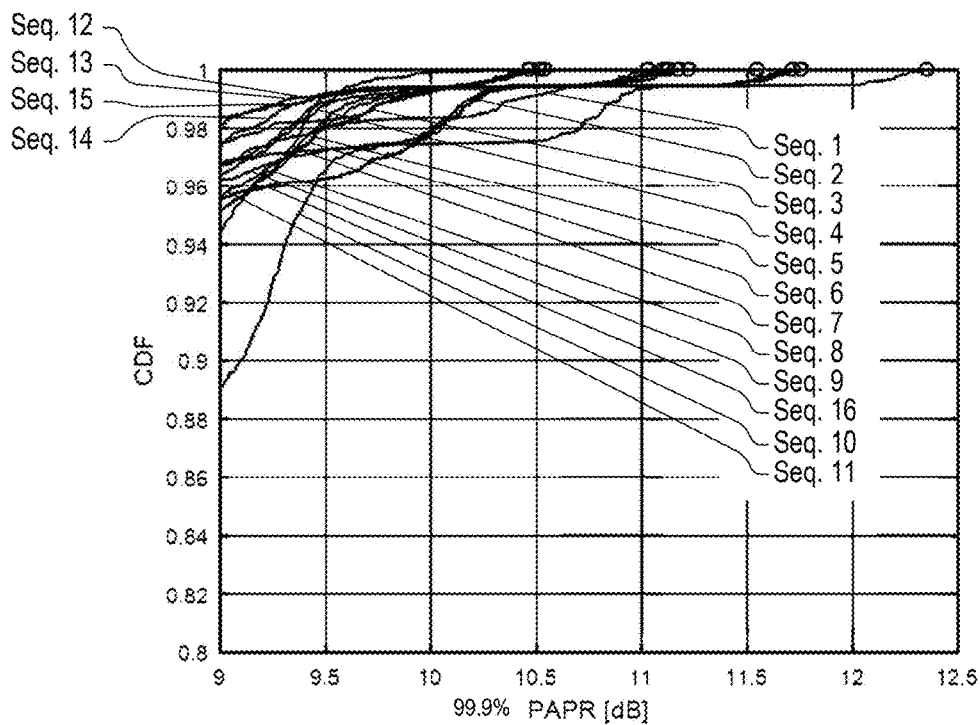
FIG. 7A illustrates 99.9% PAPRs for possible channel estimation tone sequences of an L-SIG or RL-SIG field, according to an embodiment.
FIG. 7B illustrates maximum 99.9% PAPRs for the possible channel estimation tone sequences of the L-SIG or RL-SIG field, according to an embodiment.

FIG. 7A is a graph showing the cumulative distribution function (CDF) of 99.9% PAPR for different extra tone sequences 1 to 16, respectively (Seq. 1 to Seq. 16). As an illustrative example, the point on FIG. 7A at which the line for Sequence 8 has a CDF of 0.999 (a 99.9% PAPR) of approximately 10.53 decibels (dB) indicates that 99.9% of the possible valid PAPR values for an L-SIG field of an HE PPDU are less than or equal to approximately 10.53 decibels when Sequence 8 is used for the extra tones.

FIG. 7B includes a Table 2 showing the values for each of sequence 1 to sequence 16 and the maximum 99.9% PAPR values (that is, values for a ratio of 99.9% of the peak power to the average power, in decibels) for each. As shown in FIGS. 7A and 7B, different sequences for the extra tones do result in different maximum 99.9% PAPR values.

Figures 8A, 8B:
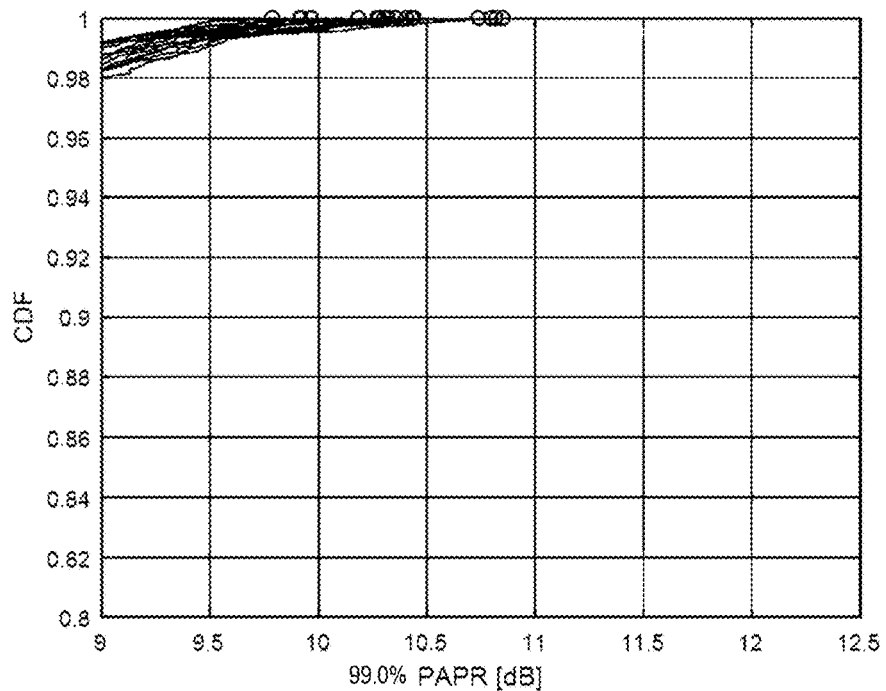
FIG. 8A illustrates 99.0% PAPRs for possible channel estimation tone sequences of an L-SIG or RL-SIG field, according to an embodiment.
FIG. 8B illustrates maximum 99.0% PAPRs for the possible channel estimation tone sequences of the L-SIG or RL-SIG field, according to an embodiment.

FIG. 8A is a graph showing the CDF of 99.0% PAPR (that is, values for a ratio of 99.0% of the peak power to the average power, in decibels) for different extra tone sequences 1 to 16, respectively. Because the lines for the sequences are so close, labeling of the sequences is omitted for clarity.

FIG. 8B includes a Table 3 showing the values for each of sequence 1 to sequence 16 and the maximum 99.0% PAPR values for each. As shown in FIGS. 8A and 8B, different sequences do result in different maximum 99.0% PAPR values.

In FIG. 7B, three sequences (Options 1, 2, and 3) for the extra tones that produce the three lowest 99.9% PAPR values are identified as options for use as the values of extra tones of the L-SIG and RL_SIG fields of an HE PPDU.

Option 1 is Sequence 7 having values of {+1, −1, −1, +1} for subcarriers (−28, −27, +27, +28), respectively. In an embodiment, the sequence {+1, −1, −1, +1} corresponding to Option 1 is used for the extra tones.

Option 2 is Sequence 8 having values of {−1, −1, −1, +1} for subcarriers (−28, −27, +27, +28), respectively. In an embodiment, the sequence {−1, −1, −1, +1} corresponding to Option 2 is used for the extra tones.

Option 3 is Sequence 15 having values of {+1, −1, −1, −1} for subcarriers (−28, −27, +27, +28}, respectively. In an embodiment, the sequence {+1, −1, −1, −1} corresponding to Option 3 is used for the extra tones.

In FIG. 8B, two additional sequences (Options 4 and 5) for the extra tones that produce low 99.0% PAPR values are identified as options for use as the extra tones of the L-SIG and RL_SIG fields of an HE PPDU.

Option 4 is Sequence 3 having values of {+1, −1, +1, +1} for subcarriers (−28, −27, +27, +28}, respectively. In an embodiment, the sequence {+1, −1, +1, +1} corresponding to Option 4 is used for the extra tones.

Option 5 is Sequence 11 having values of {+1, −1, +1, −1} for subcarriers (−28, −27, +27, +28}, respectively. In an embodiment, the sequence {+1, −1, +1, −1} corresponding to Option 5 is used for the extra tones.

Embodiments use a sequence selected from Options 1, 2, 3, 4, and 5, above, as the values of extra tones of an L-SIG field and an RL-SIG field of an HE PPDU to achieve a lower PAPR for a preamble of the HE PPDU.

In an embodiment wherein 99.9% PAPR performance is most important, the sequence is selected from Options 1, 2, and 3.

In an embodiment wherein 99.0% PAPR performance is most important, the sequence is selected from Options 4 and 5.

The solutions provided herein have been described with reference to a wireless LAN system; however, it should be understood that these solutions are also applicable to other network environments, such as cellular telecommunication networks, wired networks, etc.

The above explanation and figures are applied to an HE station, an HE frame, an HE PPDU, an HE-SIG field and the like of the IEEE 802.11ax amendment, but they can also applied to a receiver, a frame, PPDU, a SIG field, and the like of another future amendment of IEEE 802.11.

Embodiments of the present disclosure include electronic devices configured to perform one or more of the operations described herein. However, embodiments are not limited thereto.

Embodiments of the present disclosure may further include systems configured to operate using the processes described herein. The systems may include basic service sets (BSSs) such as the BSSs 100 of FIG. 1, but embodiments are not limited thereto.

Embodiments of the present disclosure may be implemented in the form of program instructions executable through various computer means, such as a processor or microcontroller, and recorded in a non-transitory computer-readable medium. The non-transitory computer-readable medium may include one or more of program instructions, data files, data structures, and the like. The program instructions may be adapted to execute the processes and to generate and decode the frames described herein when executed on a device such as the wireless devices shown in FIG. 1.

In an embodiment, the non-transitory computer-readable medium may include a read only memory (ROM), a random access memory (RAM), or a flash memory. In an embodiment, the non-transitory computer-readable medium may include a magnetic, optical, or magneto-optical disc such as a hard disk drive, a floppy disc, a CD-ROM, and the like.

In some cases, an embodiment of the invention may be an apparatus (e.g., an AP station, a non-AP station, or another network or computing device) that includes one or more hardware and software logic structure for performing one or more of the operations described herein. For example, as described above, the apparatus may include a memory unit, which stores instructions that may be executed by a hardware processor installed in the apparatus. The apparatus may also include one or more other hardware or software elements, including a network interface, a display device, etc.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. A method performed by a wireless device, the method comprising:
generating a frame including a first field and a second field immediately following the first field; and
transmitting the frame,
wherein the first field is associated with a first set of subcarriers, and a set of tones for channel estimation are transmitted on the first set of subcarriers in the first field,
wherein the second field is associated with a second set of subcarriers, the second set of subcarriers includes the first set of subcarriers and four extra subcarriers, and a first set of four extra tones for channel estimation are transmitted on the four extra subcarriers in the second field,
wherein first, second, third, and fourth values of the first set of four extra tones respectively correspond to Binary Phase Shift Keying (BPSK) constellation values of −1, −1, −1, and +1.

2. The method of claim 1, wherein the four extra subcarriers correspond to −28th, −27th, 27th, and 28th subcarriers, relative to a center (zero) subcarrier, of a 20 MHz bandwidth of the frame.

3. The method of claim 2, wherein the first field is a Non-High Throughput Long Training Field (L-LTF), and the second field is a Non-High Throughput SIGNAL (L-SIG) field.

4. The method of claim 3, wherein the first, second, third, and fourth values of the first set of four extra tones are respectively transmitted on the −28th, −27th, 27th, and 28th subcarriers of the second field.

5. The method of claim 4, wherein the frame further includes a third field which immediately follows the second field,
wherein the third field is associated with the second set of subcarriers, and a second set of four extra tones for channel estimation are transmitted on the four extra subcarriers in the third field,
wherein first, second, third, and fourth values of the second set of four extra tones respectively correspond to BPSK constellation values of −1, −1, −1, and +1.

6. The method of claim 5, wherein the first, second, third, and fourth values of the second set of four extra tones are respectively transmitted on the −28th, −27th, 27th, and 28th subcarriers of the third field.

7. The method of claim 6, wherein the third field is a Repeated Non-High Throughput SIGNAL (RL-SIG) field.

8. The method of claim 6, wherein a duration of the first field is 4 µs, a duration of the second field is 4 µs, and a duration of the third field is 4 µs.

9. The method of claim 6, wherein a subcarrier spacing of the first field is 312.5 kHz, a subcarrier spacing of the second field is 312.5 kHz, and a subcarrier spacing of the third field is 312.5 kHz.

10. The method of claim 6, wherein the first field has a guard interval of 1.6 µs, the second field has a guard interval of 0.8 µs, and the third field has a guard interval of 0.8 µs.

11. A method performed by a wireless device, the method comprising:
    receiving a frame including a first field and a second field immediately following the first field, wherein the first field is associated with a first set of subcarriers, a set of tones for channel estimation are transmitted on the first set of subcarriers in the first field, the second field is associated with a second set of subcarriers, the second set of subcarriers include the first set of subcarriers and four extra subcarriers, and a first set of four extra tones for channel estimation are transmitted on the four extra subcarriers in the second field; and
    detecting the first set of four extra tones in the second field,
    wherein first, second, third, and fourth values of the first set of four extra tones respectively correspond to Binary Phase Shift Keying (BPSK) constellation values of −1, −1, −1, and +1.

12. The method of claim 11, wherein the four extra subcarriers correspond to −28th, −27th, 27th, and 28th subcarriers, relative to a center (zero) subcarrier, of a 20 MHz bandwidth of the frame.

13. The method of claim 12, wherein the first field is a Non-High Throughput Long Training Field (L-LTF), and the second field is a Non-High Throughput SIGNAL field (L-SIG).

14. The method of claim 13, wherein the first, second, third, and fourth values of the first set of four extra tones are respectively transmitted on the −28th, −27th, 27th, and 28th subcarriers of the second field.

15. The method of claim 14, wherein the frame further includes a third field which immediately follows the second field,
    wherein the third field is associated with the second set of subcarriers, and a second set of four extra tones for channel estimation are transmitted on the four extra subcarriers in the third field, and
    wherein first, second, third, and fourth values of the second set of four extra tones respectively correspond to BPSK constellation values of −1, −1, −1, and +1.

16. The method of claim 15, wherein the first, second, third, and fourth values of the second set of four extra tones are respectively transmitted on the −28th, −27th, 27th, and 28th subcarriers of the third field.

17. The method of claim 16, wherein the third field is a Repeated Non-High Throughput SIGNAL (RL-SIG) field.

18. The method of claim 16, wherein a duration of the first field is 4 µs, a duration of the second field is 4 µs, and a duration of the third field is 4 µs.

19. The method of claim 16, wherein a subcarrier spacing of the first field is 312.5 kHz, a subcarrier spacing of the second field is 312.5 kHz, and a subcarrier spacing of the third field is 312.5 kHz.

20. The method of claim 16, further comprising:
    estimating a channel by using the first set of four extra tones and the second set of four extra tones.

* * * * *